(12) United States Patent
Ozawa et al.

(10) Patent No.: US 8,232,641 B2
(45) Date of Patent: Jul. 31, 2012

(54) WIRING SUBSTRATE AND SEMICONDUCTOR DEVICE HAVING CONNECTION PADS FORMED IN NON-SOLDER MASK DEFINED STRUCTURE

(75) Inventors: Takashi Ozawa, Nagano (JP); Seiji Sato, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 135 days.

(21) Appl. No.: 12/782,054

(22) Filed: May 18, 2010

(65) Prior Publication Data

US 2010/0295174 A1    Nov. 25, 2010

(30) Foreign Application Priority Data

May 21, 2009 (JP) .............................. P2009-123040

(51) Int. Cl.
*H01L 23/48* (2006.01)
*H01L 23/52* (2006.01)
*H01L 29/40* (2006.01)

(52) U.S. Cl. .. 257/737; 257/778; 257/780; 257/E23.021

(58) Field of Classification Search ........................ None
See application file for complete search history.

(56) References Cited

U.S. PATENT DOCUMENTS

| | | | |
|---|---|---|---|
| 2001/0008309 A1* | 7/2001 | Iijima et al. | 257/737 |
| 2005/0023704 A1* | 2/2005 | Lin et al. | 257/781 |
| 2007/0145553 A1* | 6/2007 | Araki et al. | 257/678 |
| 2008/0185735 A1* | 8/2008 | Pham et al. | 257/778 |

FOREIGN PATENT DOCUMENTS

| | | |
|---|---|---|
| JP | 2007-158081 | 6/2007 |
| JP | 2007-194598 | 8/2007 |

* cited by examiner

*Primary Examiner* — Nathan Ha
*Assistant Examiner* — Michael Jung
(74) *Attorney, Agent, or Firm* — Drinker Biddle & Reath LLP (57) ABSTRACT

A wiring substrate includes: a semiconductor chip on which a plurality of bumps are mounted, and a plurality of connection pads which are joined to the bumps mounted on the semiconductor chip in a flip chip method, wherein the connection pads of a peripheral portion of the wiring substrate are formed in a non-solder mask defined structure, and the connection pads of a center portion of the wiring substrate are formed in a solder mask defined structure.

7 Claims, 10 Drawing Sheets

Related Art

*FIG. 7*

Related Art

Related Art

FIG. 11

Related Art

FIG. 12

Related Art

WIRING SUBSTRATE AND SEMICONDUCTOR DEVICE HAVING CONNECTION PADS FORMED IN NON-SOLDER MASK DEFINED STRUCTURE

CROSS-REFERENCE TO RELATED APPLICATION

This application is based on and claims priority under 35 U.S.C. §119 from Japanese Patent Application No. 2009-123040 filed on May 21, 2009.

BACKGROUND OF THE INVENTION

1. Technical Field

The present invention is related to a wiring substrate and a semiconductor device. More specifically, the present invention is directed to a wiring substrate equipped with Connection pads which are joined to bumps of a semiconductor Chip in a flip chip method, and directed to a semiconductor device in which the semiconductor chip is joined to the wiring substrate in the flip chip method.

2. Description of the Related Art

Recently, packaging structures have been utilized in various sorts of fields, in which bumps are provided as external connection terminals on electronic components (for example, semiconductor chips), and the bumps are joined to connection pads provided on wiring substrates by employing joint materials in the flip chip manner.

For instance, technical ideas described in JP-A-2007-194598 and JP-A-2007-158081 have been proposed as conventional wiring substrates.

Figure 6:
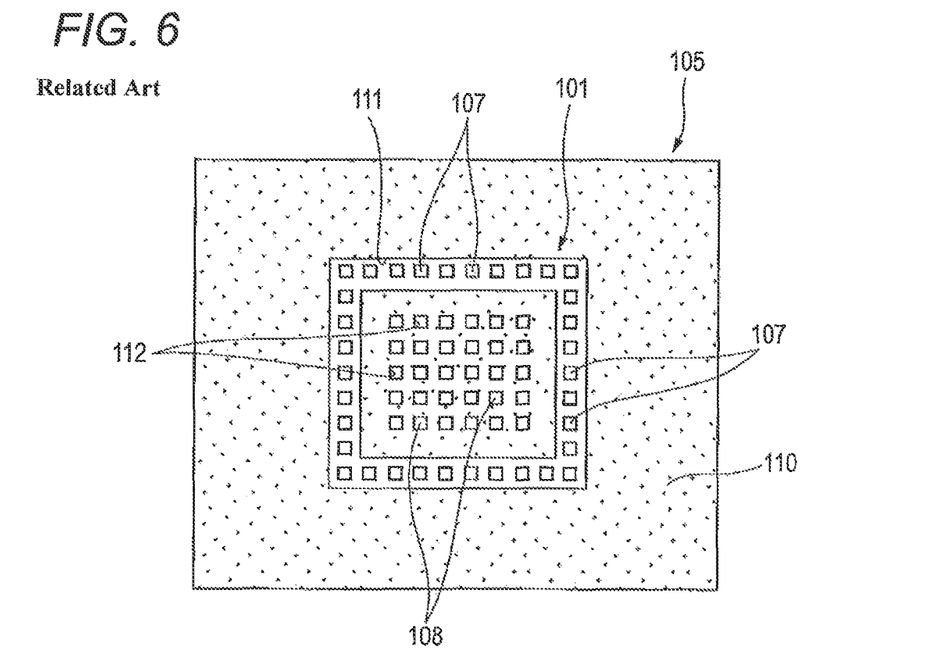
FIG. 6 is the schematic diagram for representing the example of the wiring substrate related to the conventional embodiment mode.
Figure 7:
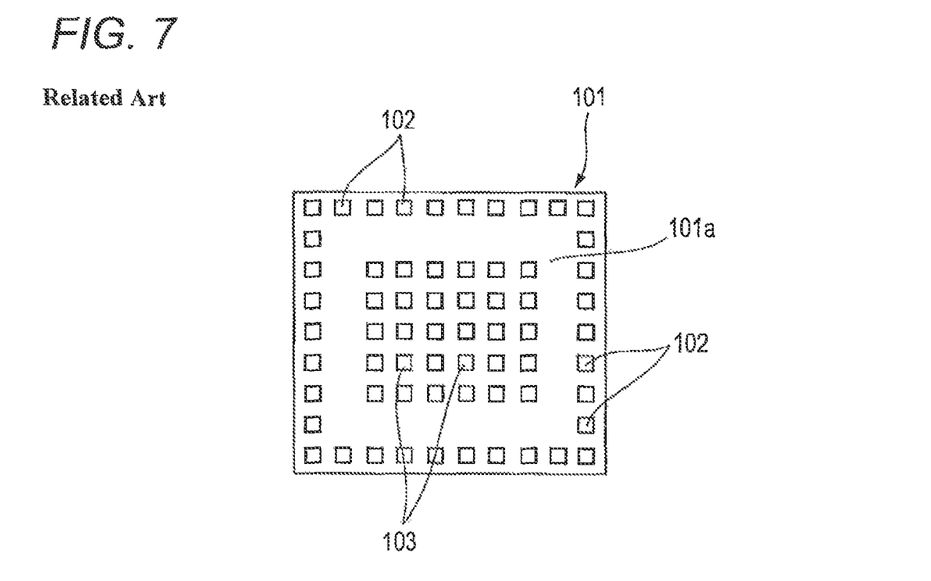
FIG. 7 is the schematic diagram for indicating the example of the semiconductor chip which is mounted on the wiring substrate in FIG. 6.

FIG. 6 is a plan view (schematic diagram) for showing one example of a wiring substrate 105 on which a semiconductor chip 101 shown in FIG. 7 is mounted in a flip chip manner. In this case, while FIG. 7 is a plan view for showing a circuit forming plane 101a of the semiconductor chip 101, when the semiconductor chip 101 is mounted on the wiring substrate 105 in the flip chip method, the mounting process is carried out in a face down manner in such a manner that the circuit forming plane 101a is located opposite to the wiring substrate 105.

Bumps (namely, outer peripheral bumps 102 and central bumps 103) made by employing Au (gold) have been formed on the circuit forming plane 101a of the semiconductor chip 101. The outer peripheral bumps 102 have been arranged on a peripheral portion of the circuit forming plane 101a (peripheral-shaped arrangement). Also, the central bumps 103 have been arranged in a center portion of the circuit forming plane 101a (area array-shaped arrangement). Conventionally, generally speaking, in semiconductor chips in which bumps are employed as external connection terminals, the below-mentioned structures are usually utilized. That is, these bumps are arranged in peripheral portions of the semiconductor chips in peripheral shapes. However, since semiconductor chips have been recently packaged in high density, total terminal numbers of these semiconductor chips are increased, so that the central bumps 103 are arranged also in the center portions of the circuit forming planes 101a.

In connection with the arrangement, the wiring substrate 105 on which the semiconductor chip 101 is mounted in the flip chip manner has such a structure that connection pads (outer peripheral pads) 107 corresponding to the outer peripheral bumps 102 and connection pads (central pads) 108 corresponding to the central bumps 103 are arranged (refer to FIG. 6). In this structure, the connection pads (outer peripheral pads) 107 are formed on a frame-shaped opening portion 111 provided in a solder mask (resist) 110. Also, the connection pads (central pads) 108 are formed on respective opening portions 112 provided on the solder mask (resist) 110.

In this case, as structures for forming connection pads (and positioning marks which will be described later) on wiring substrates, there are an NSMD (Non-Solder Mask Defined) structure and an SMD (Solder Mask Defined) structure.

Figure 8A:
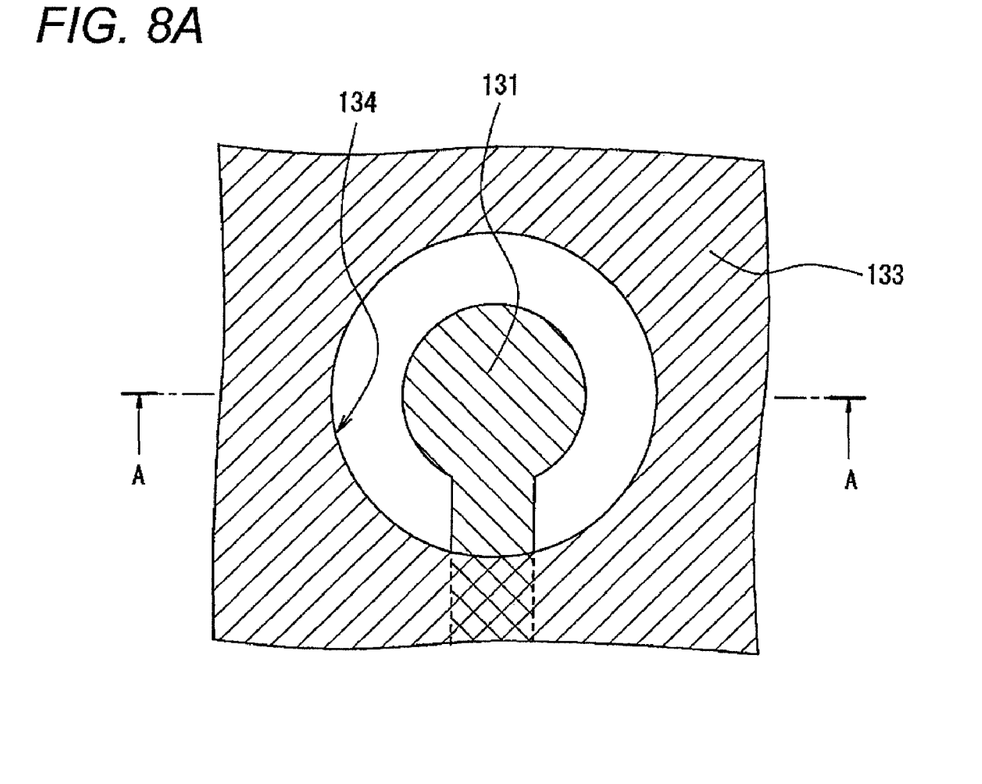
FIGS. 8A and 8B are explanatory diagrams for explaining a non-solder mask defined (NSMD) structure.
Figure 8B:
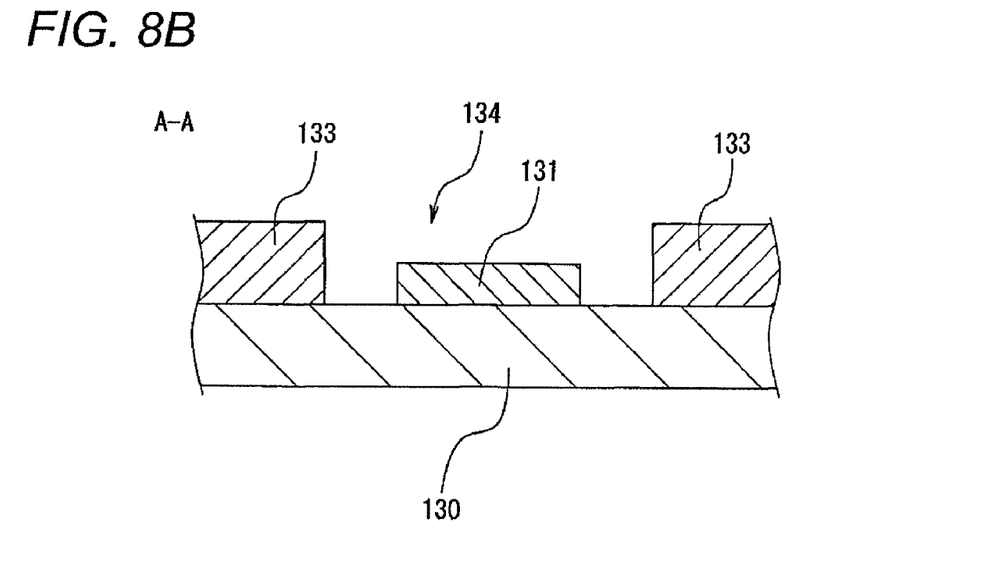

As shown in a plan view in FIG. 8A and a front sectional view in FIG. 8B (namely, sectional view, taken along line A-A in FIG. 8A), the NSMD structure corresponds to such a structure that a connection pad 131 is defined as a conductor shape within an opening portion 134 of a solder mask (resist) 133, while an inner diameter of the opening portion 134 is made larger than an outer diameter of a circular portion of the connection pad 131. It should be noted that symbol 130 indicates an insulating layer which constitutes a base.

Figure 9A:
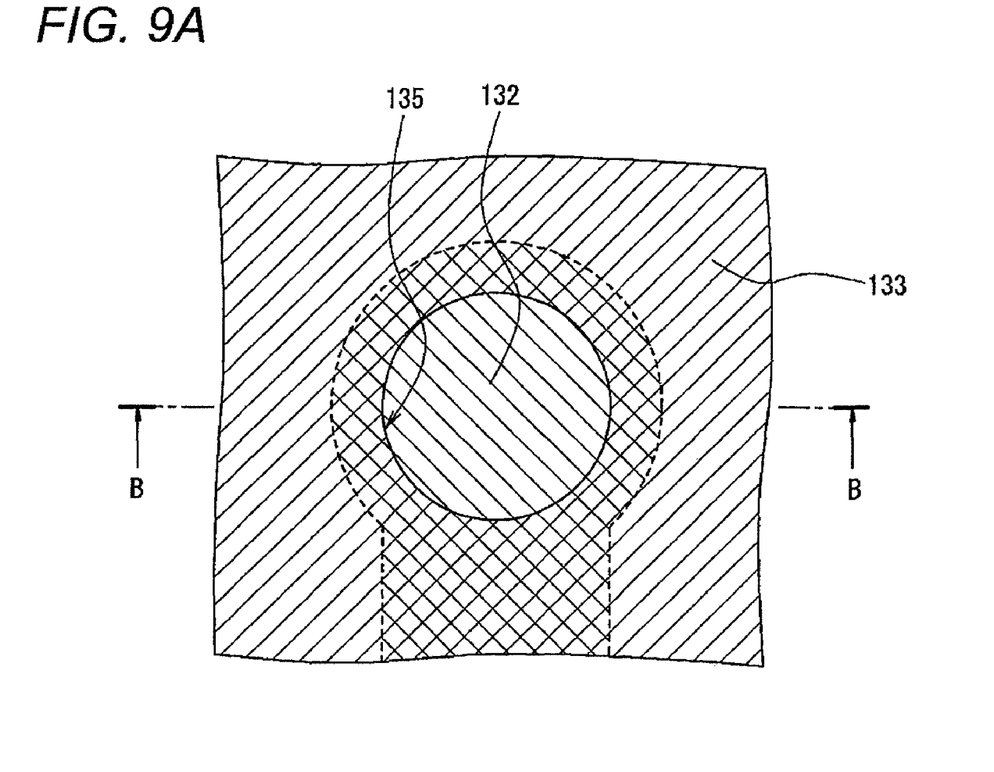
FIGS. 9A and 9B are explanatory diagrams for explaining a solder mask defined (SMD) structure.
Figure 9B:
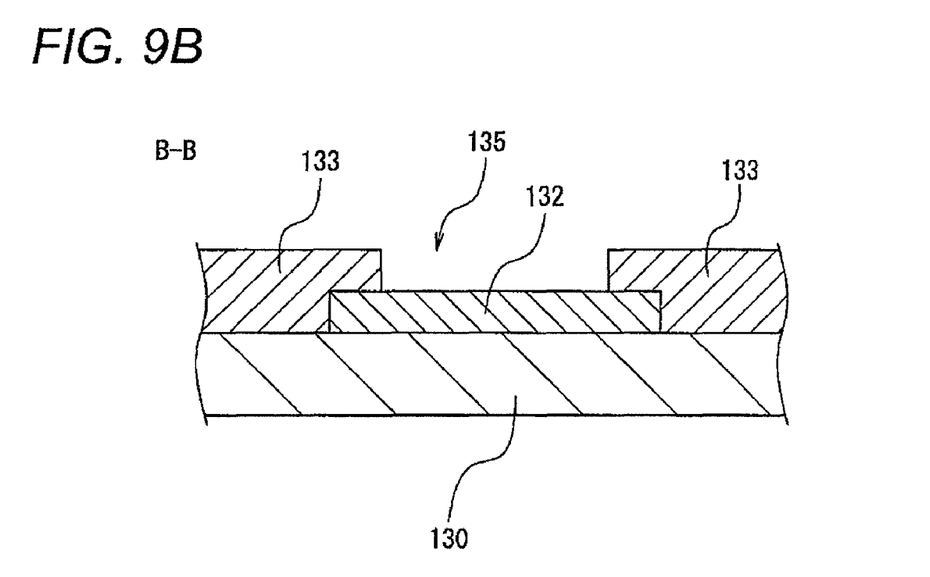

On the other hand, as indicated in a plan view in FIG. 9A and a front sectional view in FIG. 9B (namely, sectional view, taken along line B-B in FIG. 9A), the SMD structure corresponds to such a structure that a connection pad 132 is defined based upon an opening shape (namely, shape of opening portion 135) of a solder mask (resist) 133, while an inner diameter of the opening portion 135 is made smaller than an outer diameter of a circular portion of the connection pad 132.

On the other hand, in the case that semiconductor chips are mounted on wiring substrates in the flip chip manner, positioning marks have been employed in order to join the semiconductor chips at predetermined positions. Normally, the positioning marks are formed on the wiring substrates.

Figure 10:
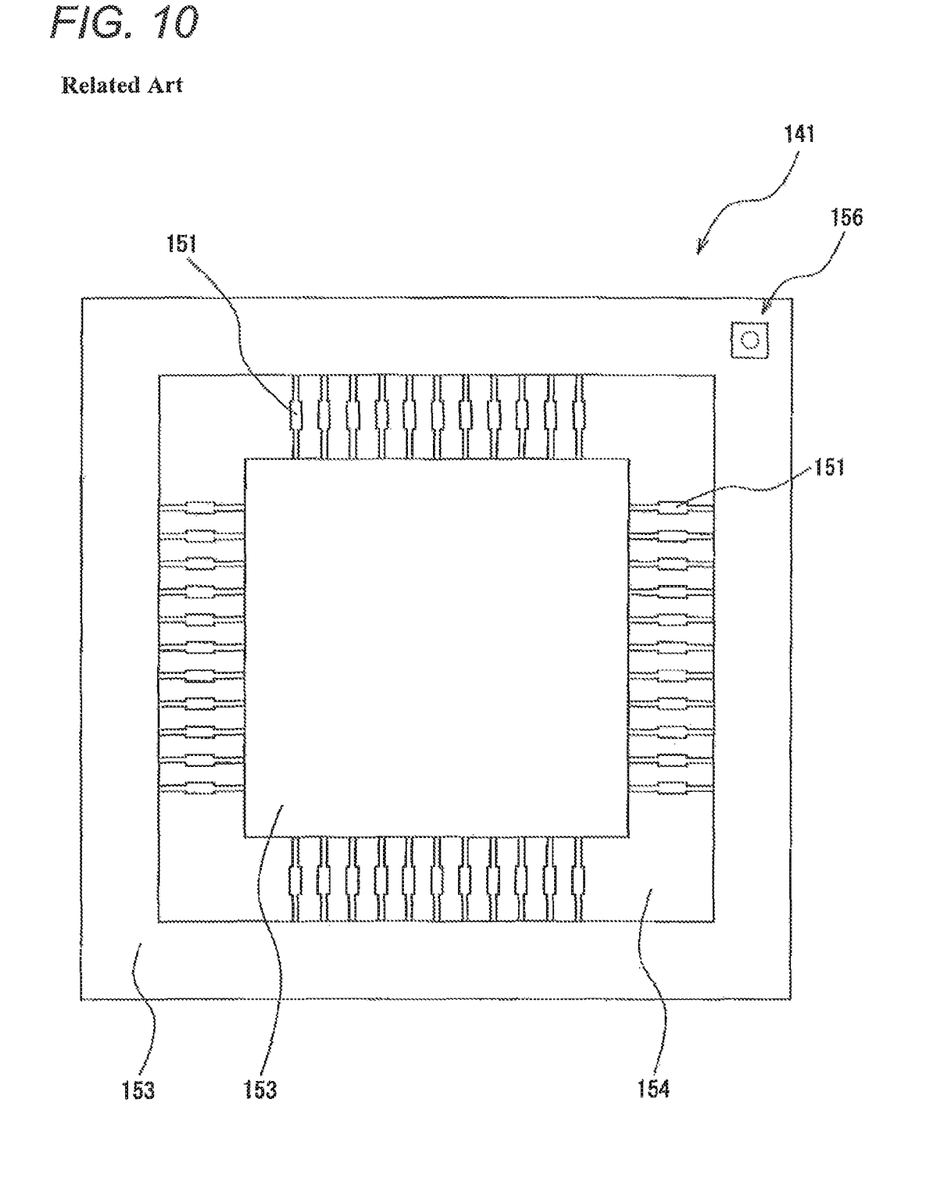
FIG. 10 is the schematic diagram for showing the example of the wiring substrate (in case that wiring substrate is provided with connection pads arrayed in peripheral shape) related to the conventional embodiment mode.

Conventionally, as shown in FIG. 10, in the case that a semiconductor chip (not shown) having peripheral-shape arrayed bumps is mounted on a wiring substrate 141 in the flip chip manner, normally, an NSMD structure defined based upon a shape of a conductor (namely, connection pads 151) provided in an opening portion 154 of a solder mask 153 is employed in connection pads 151 formed on the wiring substrate 141, and also, the NSMD structure is similarly employed in a positioning mark 156. This reason is given as follows. That is, since the structure of the positioning mark 156 is made coincident with the structure of the connection pad 151, a positioning process is accurately carried out in such a manner that a center position of the bumps formed on the semiconductor chip is made coincident with a center position of the conductors (connection pads 151) provided within the opening portion 154 of the solder mask 153 formed on the wiring substrate 141.

Figure 11:
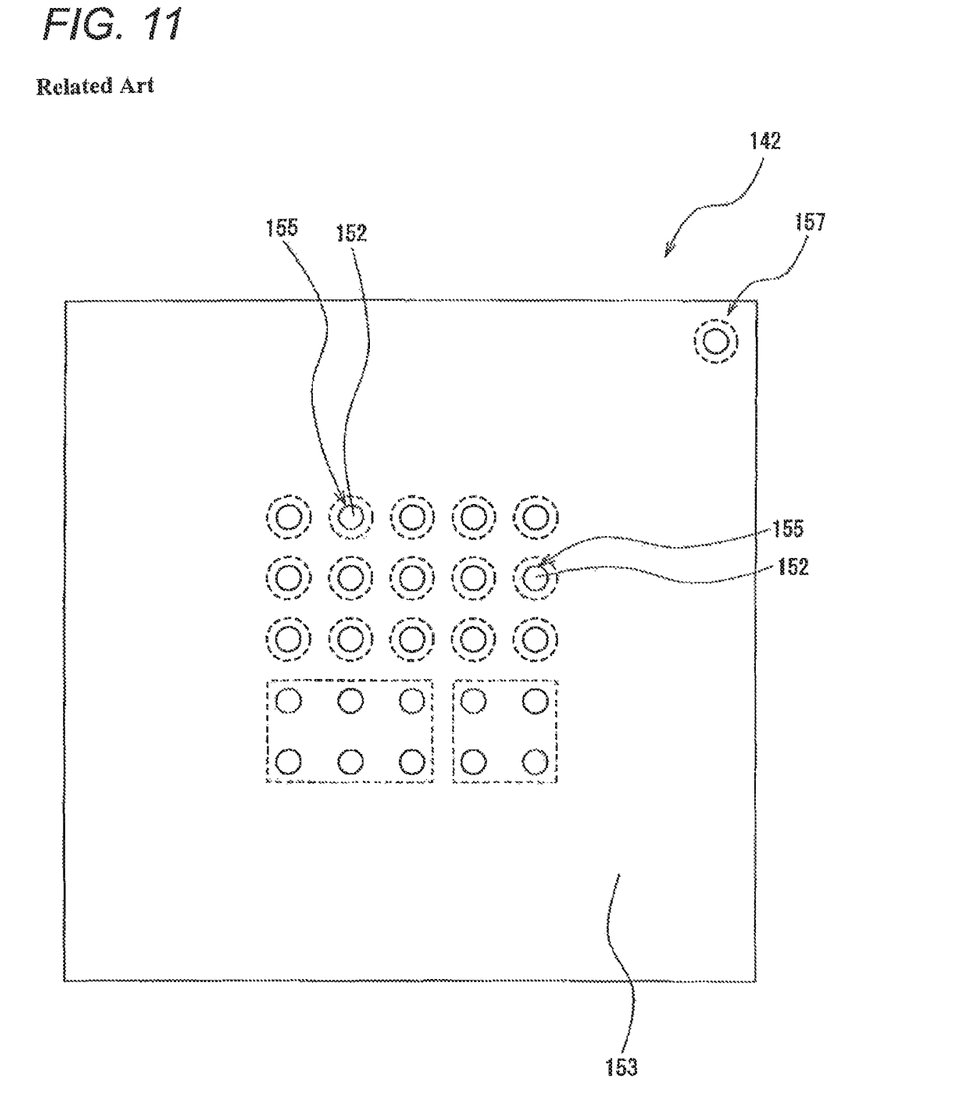
FIG. 11 is the schematic diagram for showing the example of the wiring substrate (in case that wiring substrate is provided with connection pads arrayed in area array shape) related to the conventional embodiment mode.

On the other hand, as shown in FIG. 11, in the case that a semiconductor chip (not shown) having area array-shaped arrayed bumps is mounted on a wiring substrate 142 in the flip chip manner, normally, an SMD structure defined based upon shapes of openings (namely, shapes of opening portions 155) of a solder mask 153 is employed in connection pads 152 formed on the wiring substrate 142, and also, the SMD structure is similarly employed in a positioning mark 157. This reason is given as follows. That is, since the structure of the positioning mark 157 is made coincident with the structure of the connection pad 152, a positioning process is accurately carried out in such a manner that a center position of the bumps formed on the semiconductor chip is made coincident with a center position (namely, center position of exposed portions of connection pads 152) of the opening portions 155 of the solder mask 153 formed on the wiring substrate 142. It should also be noted that portions defined by broken lines in FIG. 11 indicate one example as to shapes of edge portions of the connection pads 152 covered by the solder mask 153.

As previously described, conventionally, in order to carry out the positioning processes accurately during flip-chip mounting operations, a positioning mark employs either the NSMD structure or the SMD structure in correspondence with a structure of connection pads. As a consequence, in such a case that the semiconductor chip (refer to FIG. 6) in which the bumps arranged in the peripheral shape and the bumps arranged in the area array shape are mixed with each other is mounted on a wiring substrate 143 shown in FIG. 12, the structures as to both the connection pads 151 arrayed in the peripheral shape and the connection pads 150 arrayed the area array shape are required to be unified in either the NSMD structures or the SMD structures. At the same time, a structure of a positioning mark 158 which is provided on the wiring substrate 143 is similarly required to be unified in the same NSMD, or SMD structure. Normally, the connection pads 151 arrayed in the peripheral shape within the opening portions 154 can not be formed in the SMD structure, but can be formed in the NSMD structure, since pitches (will be referred to as "pad pitches" hereinafter) of adjoining connection pads 151 are narrow. In connection to the above-described structure aspect, the connection pads 150 arrayed in the area array shape in the center portion of the wiring substrate 143, and the positioning mark 158 are required to be formed in the NSMD structures.

Figure 12:
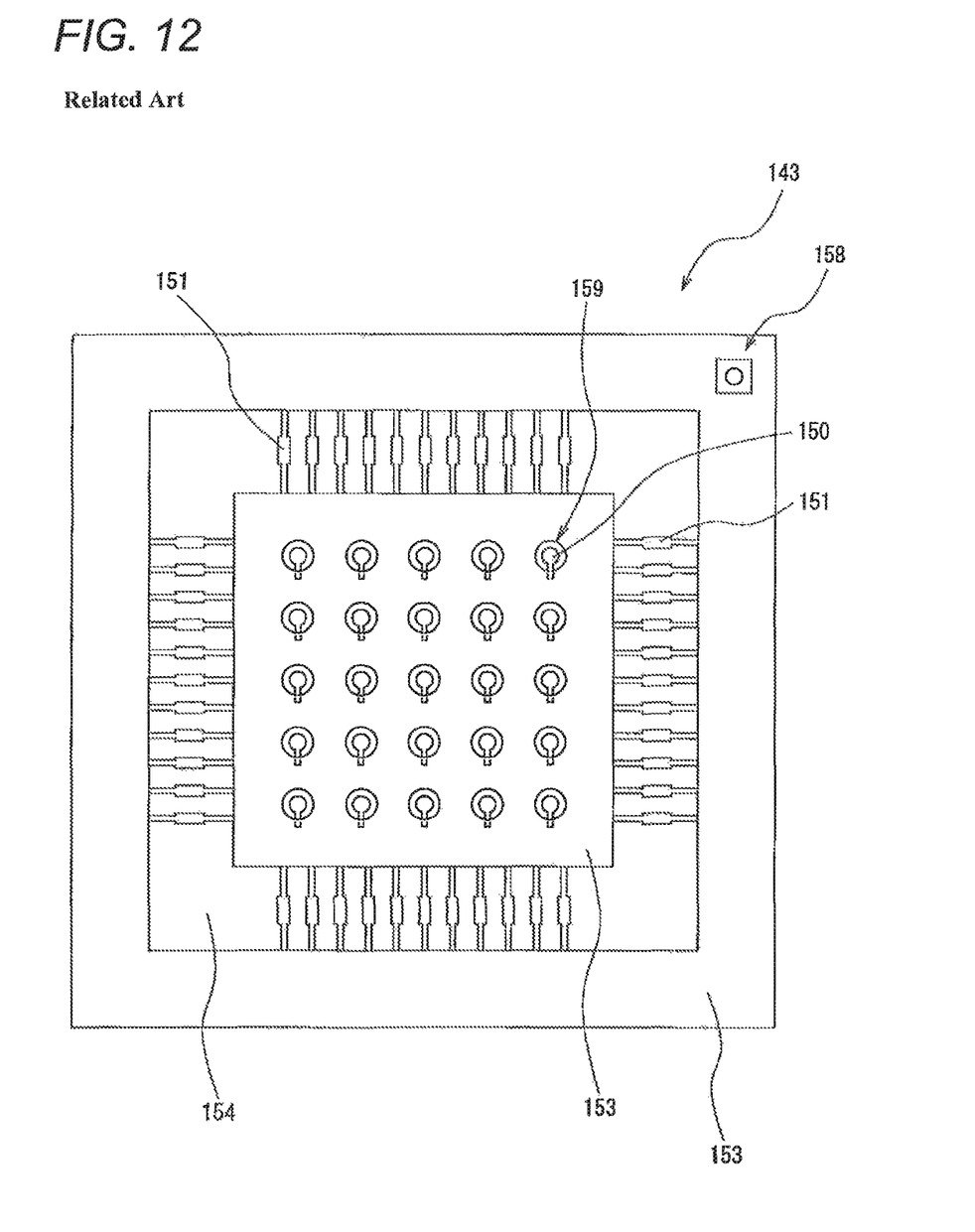
FIG. 12 is the schematic diagram for showing the example of the wiring substrate (in case that wiring substrate is provided with connection pads arrayed in peripheral shape and connection pads arrayed in area array shape) related to the conventional embodiment mode.

However, in the case that the connection pads 150 arranged in the area array shape in the central portion of the wiring substrate 143 are formed in the NSMD structure, shapes of opening portions 159 of the solder mask 153 are required to be designed to have a larger dimension than that of the solder mask 153 employing the SMD structure in order that shapes of conductors (namely, edge portions of connection pads 150) within the opening portions 159 must be exposed from front planes of the opening portions 159 (refer to FIG. 12). As a result, the below-mentioned restrictions are caused in designing aspects. That is, a power supply system line (either power supply line or ground line) of the uppermost layer of the wiring substrate 143 can be hardly formed in a plain, namely, formed in the form of a flat plate in an integral body.

The present invention is made to solve the above-described problems of the conventional technique, and therefore, has an object to provide a wiring substrate having a superior electric characteristic, to which a semiconductor chip where bumps arranged in a peripheral shape and bumps arranged in an area array shape are mixed with each other is mounted in a flip chip manner.

SUMMARY OF THE INVENTION

As one embodiment mode, the problems are solved by the below-disclosed solving means.

According to a first aspect of the invention, there is provided a wiring substrate including:

a semiconductor chip on which a plurality of bumps are mounted, and a plurality of connection pads which are joined to the bumps mounted on the semiconductor chip in a flip chip method, wherein the connection pads of a peripheral portion of the wiring substrate are formed in a non-solder mask defined structure, and the connection pads of a center portion of the wiring substrate are formed in a solder mask defined structure.

According to a second aspect of the invention, there is provided the wiring substrate as in the first aspect, further including:

a positioning mark employed in a positioning process when the semiconductor chip is joined to the wiring substrate in the flip chip method, wherein the positioning mark is formed in the non-solder mask defined structure.

According to a third aspect of the invention, there is provided the wiring substrate as in the first or the second aspect, wherein a pitch of the adjoining connection pads of the peripheral portion of the wiring substrate is 100 μm or less; and a pitch of the adjoining connection pads of the center portion of the wiring substrate is 100 μm or more.

According to a fourth aspect of the invention, there is provided the wiring substrate as in any one of the first to third aspects, wherein a plurality of or all of the connection pads of the center portion of the wiring substrate are formed in a flat plate shape in an integral body.

According to a fifth aspect of the invention, there is provided a semiconductor device manufactured by joining the bumps of the semiconductor chip in the flip chip method to the connection pads of the wiring substrate as in any one of the first to fourth aspects.

BRIEF DESCRIPTION OF THE DRAWINGS

A general architecture that implements the various features of the invention will now be described with reference to the drawings. The drawings and the associated descriptions are provided to illustrate embodiments of the invention and not limited the scope of the invention.

DETAILED DESCRIPTION OF THE PREFERRED EMBODIMENTS

Figure 1:
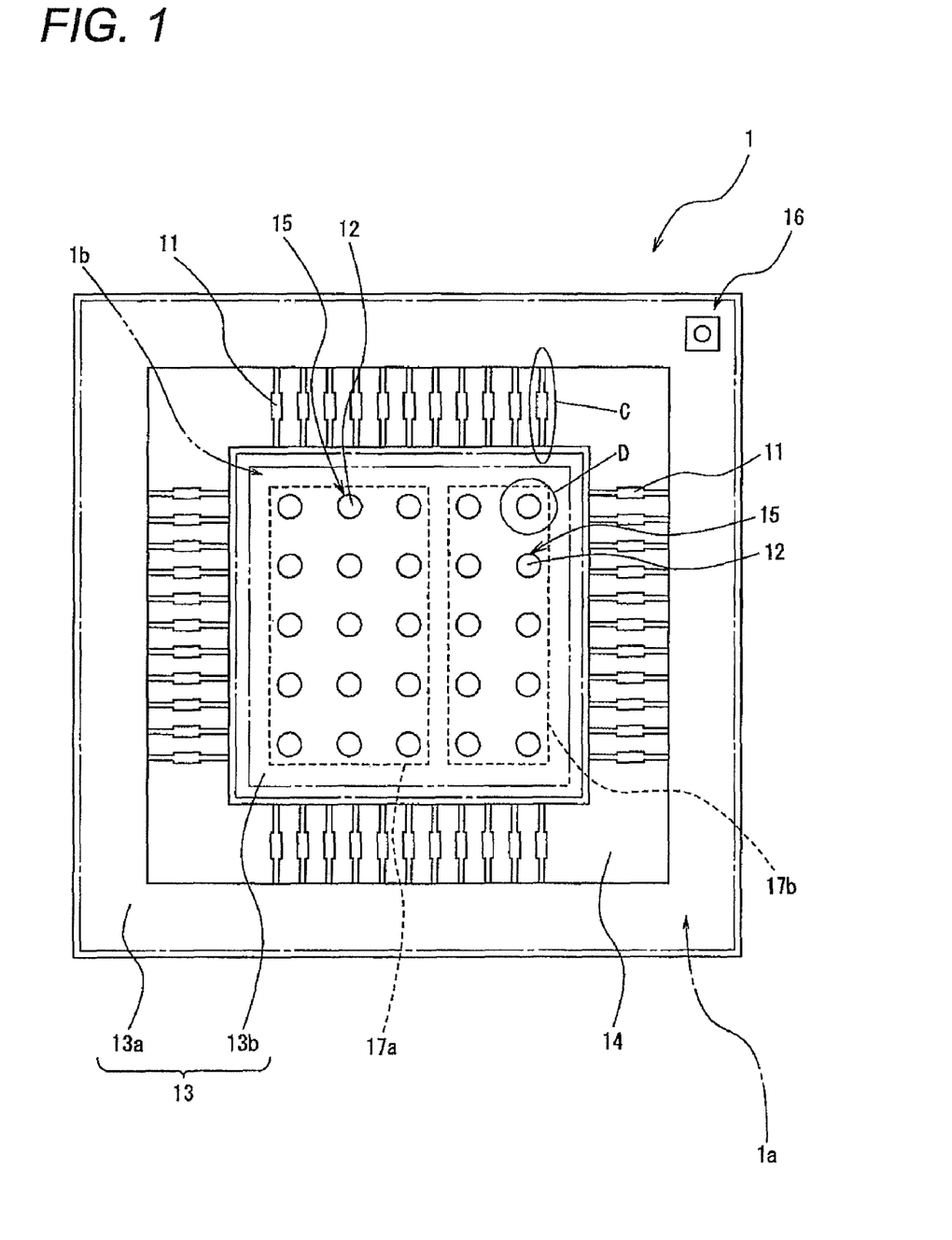
FIG. 1 is a schematic diagram for indicating an example of a wiring substrate according to an embodiment mode of the present invention.

A plan view (schematic diagram) of a wiring substrate 1 according to an embodiment made of the present invention is shown in FIG. 1. The wiring substrate 1 corresponds to a wiring substrate to which a semiconductor chip 2 (refer to FIG. 2) is joined in a flip chip manner. The semiconductor chip 2 is joined to the wiring substrate 1 in a face down manner based upon the flip chip method in such a manner that a circuit forming plane 2a of the semiconductor chip 2 is located opposite to the wiring substrate 1, so that a semiconductor device 3 is formed. A front sectional view (schematic diagram) of the semiconductor device 3 is represented in FIG. 3. As shown in FIG. 3, bumps 21 and 22 of the semiconductor chip 2 are joined to corresponding connection pads 11 and 12 of the wiring substrate 1 by solder 4, respectively. It should be noted that an underfill resin 5 is penetrated between the wiring substrate 1 and the semiconductor chip 2 so as to electrically insulate adjoining connection portions (connection pads 11 and 12).

Figure 2:
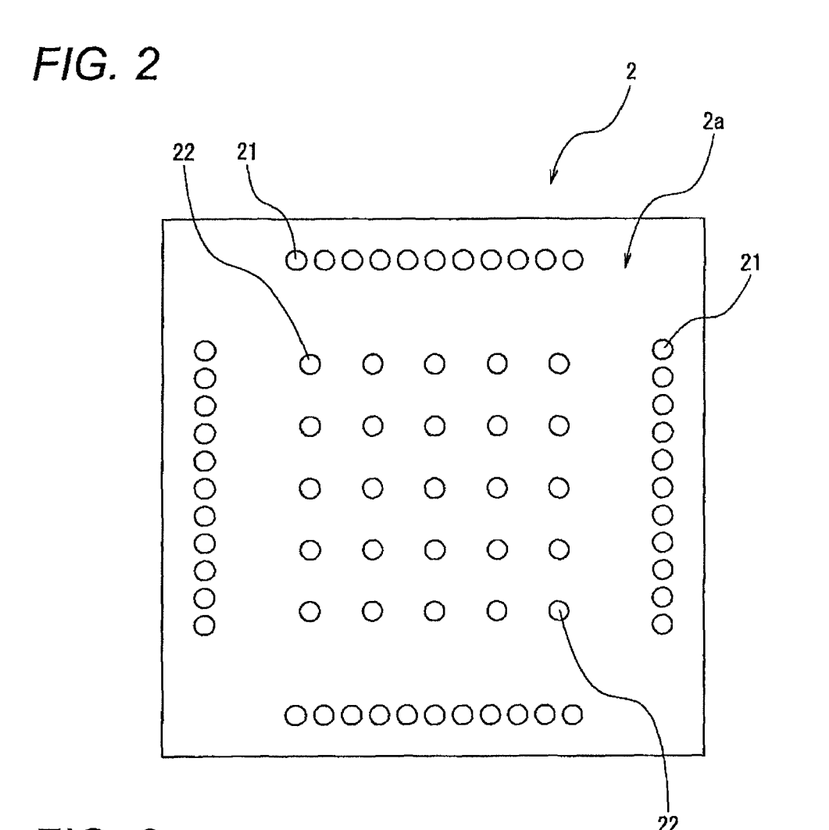
FIG. 2 is a schematic diagram for showing an example of a semiconductor chip which is mounted on the wiring substrate in FIG. 1.
Figure 3:
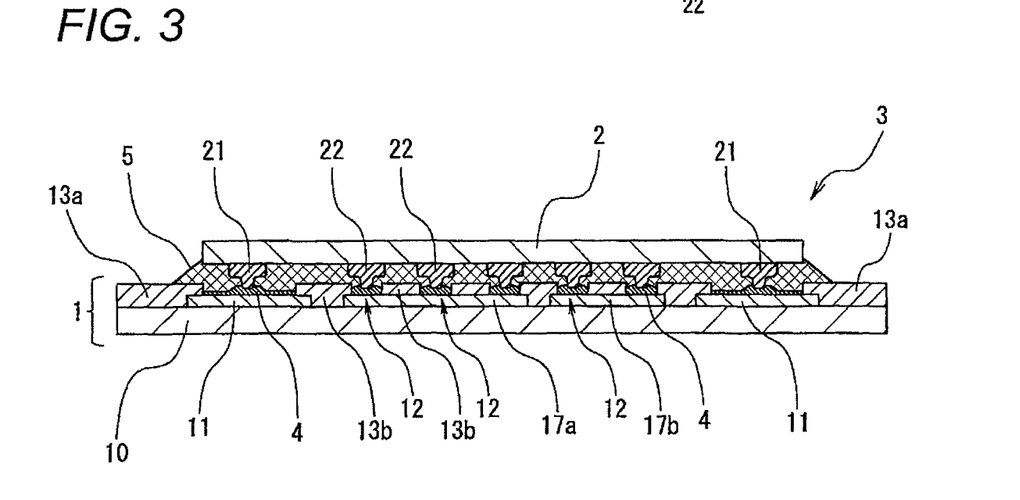
FIG. 3 is a schematic diagram (sectional view) for representing an example of a semiconductor device according to another embodiment mode of the present invention.

As shown in the plan view (schematic diagram) in FIG. 2, the semiconductor chip 2 has such a structure that the bumps 21 arranged in a peripheral shape in a peripheral portion of the circuit forming plane 2a are mixed with the bumps 22 arranged in an area array shape in a center portion of the circuit forming plane 2a. As one example, the bumps 21 and 22 are formed by employing either Au (gold) or an Au alloy based upon a wire bonding method.

As shown in FIGS. 1 and 3, the wiring substrate 1 has such a structure that the connection pads 11 and 12 to be connected to the semiconductor chip 2 have been formed on an insulating layer 10. In this example, the connection pads 11 have been arranged in the peripheral shape in a peripheral portion (namely, frame-shaped region surrounded by dot and dash line) 1a of the wiring substrate 1 in correspondence with the bumps 21 of a peripheral portion of the semiconductor chip 2 to be joined to the wiring substrate 1. On the other hand, the connection pads 12 have been arranged in the area array shape in a center portion (namely, rectangular region surrounded by two-dot and dash line) 1b of the wiring substrate 1 in correspondence with the bumps 22 of the center portion of the semiconductor chip 2 to be joined thereto.

Figure 5:
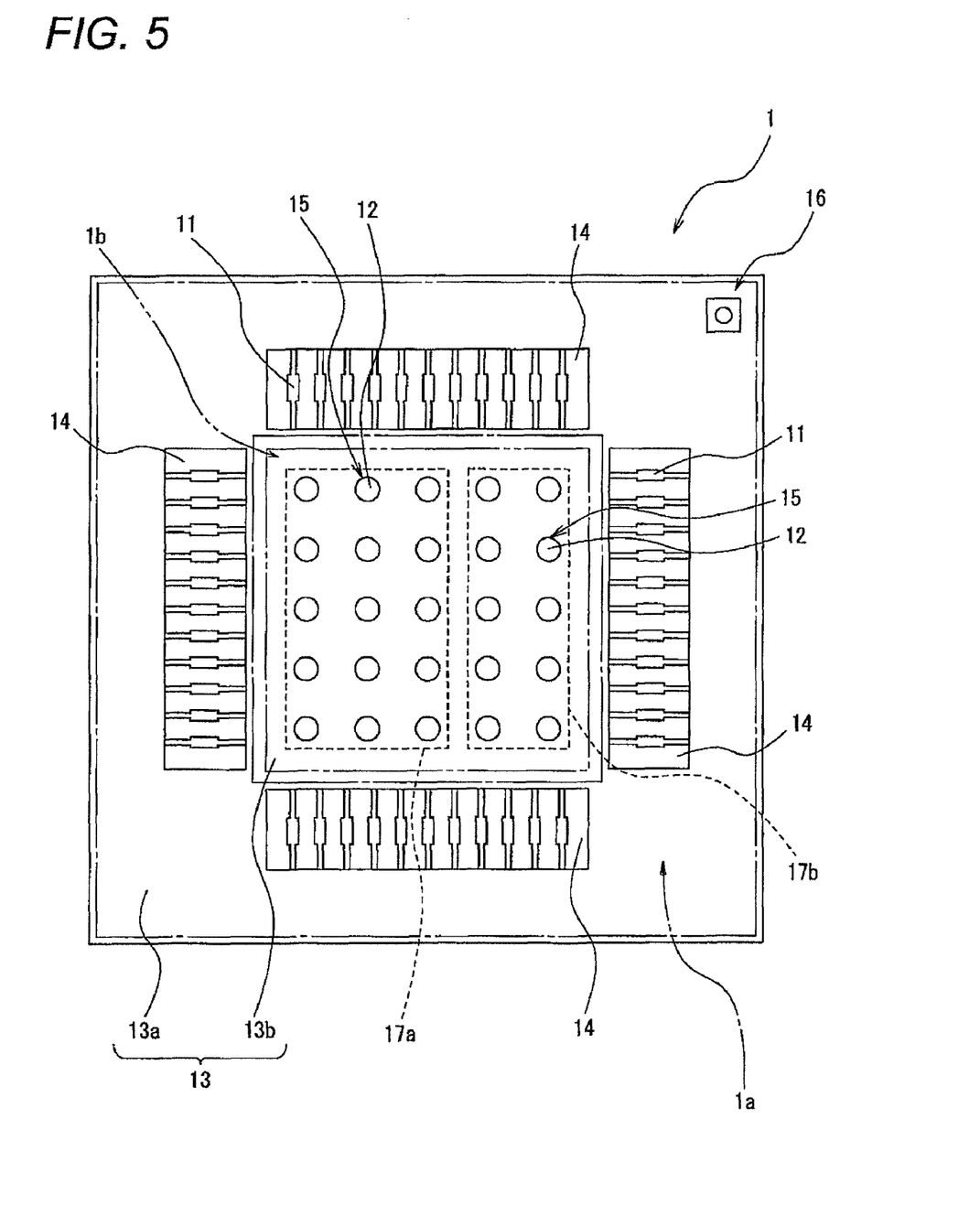
FIG. 5 is a schematic diagram for indicating a modification of the wiring substrate according to the embodiment mode of the present invention.

In this example, a solder mask (resist) 13 having an opening portion 14 and opening portions 15 are formed on the insulating layer 10, while the opening portion 14 causes the connection pads 11 to be exposed, and the opening portions 15 cause the connection pads 12 to be exposed. As one example, the opening portion 14 is formed in a frame shape. On the other hand, as one example, the opening portions 15 are formed in a circular shape. It should also be noted that as a modification of the opening portion 14, as shown in FIG. 5, opening portions 14 may be alternatively formed in rectangular shapes, which are arranged at a plurality of portions.

In the present embodiment mode, the solder mask 13 has a structure that while the opening portion 14 is sandwiched, the solder mask 13 is divided into two solder masks 13a and 13b. As a result, both ends of the connection pads 11 are covered by the solder mask 13a and the solder mask 13b respectively, whereas the connection pads 12 are covered by being surrounded by the solder mask 13b.

Also, in the present embodiment mode, for example, the connection pads 11 are connected to signal lines (not shown) of the semiconductor chip 2 to be mounted. In current semiconductor chips, quantities of terminals thereof are increased due to high density of these terminals. Accordingly, in the wiring substrate 1 which is connected to these semiconductor chips having terminals manufactured in high density, various requirements are furthermore issued, namely, the dimension of the wiring board 1 itself is required to be made more compact, and the pitches of the connection pads 11 which are connected to the signal lines are required to be furthermore narrowed.

On the other hand, for instance, the connection pads 12 are connected to either a power supply line (not shown) or a ground line (not shown) of the semiconductor chip 2 to be mounted. In current semiconductor chips, especially, since power saving requirements (operable under low voltages) are issued, it is preferable to design such an arrangement that power supply system lines (either power supply lines or ground lines) are arranged in the vicinity of center portions of these semiconductor chips, in which devices are formed. As a consequence, in the wiring substrate 1 to be joined to the semiconductor chip 2, it is preferable to similarly employ such an arrangement that the connection pads 12 to be connected to the power supply system line are provided in the vicinity of a center portion of the wiring substrate 1.

In this case, as the featured structure of the present embodiment mode, the connection pads 11 are formed in the NSMD (Non-Solder Mask Defined) structure. Since the NSMD structure is employed, pad pitches of the connection pads 11 can be made in narrow pitches. In the present embodiment mode, the pad pitches of the connection pads 11 can be made narrower than, or equal to 100 [μm].

On, the other hand, the connection pads 12 are formed in the SMD (Solder Mask Defined) structure. Since the SMD structure is employed, a power supply system line (either power supply line or ground line) of a wiring layer (namely, uppermost layer in case that wiring substrate 1 is multilayer substrate) on which the connection pads 12 are formed can be easily formed in a plain, namely can be readily manufactured in the form of a flat plate in an integral body. Since the power supply system line can be formed in the plain, an effect capable of improving an electric characteristic in the wiring substrate 1 can be achieved, for example, electric resistance values of the power supply system line can be lowered. It should also be noted that all the connection pads 12 to be formed in the SMD structure may be formed in the plain, or a portion (preselected number of connection pads 12) of all these connection pads 12 may be alternatively formed in the plain. In the present embodiment mode, as indicated by broken line portions in FIG. 1, while two plains (flat plate-shaped conductors) 17a and 17b are provided on the wiring layer, since opening portions 15 are formed at predetermined positions of the solder mask 13 which constitutes an upper layer of these plains 17a and 17b in order to expose these plains 17a and 17b, so that the connection pads 12 are formed.

Figure 4A:
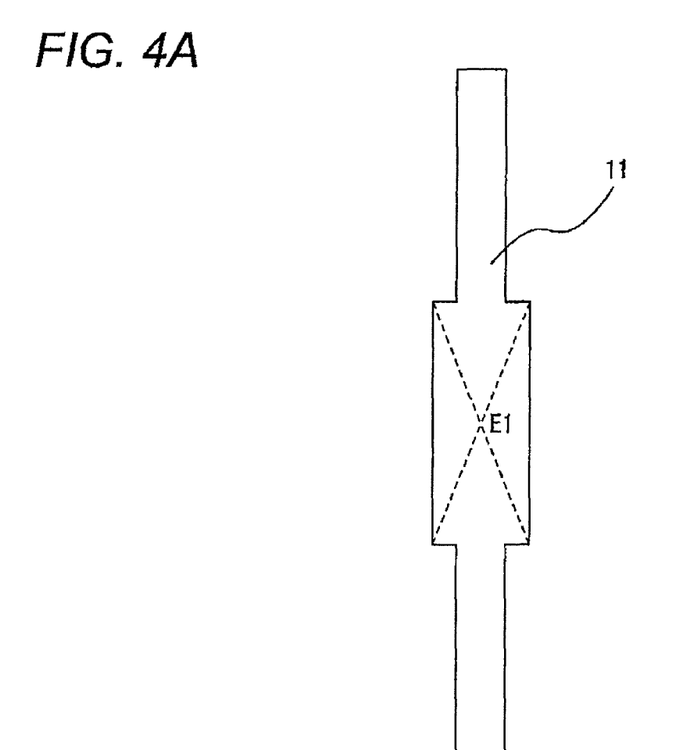
FIGS. 4A and 4B are partially enlarged views for indicating the wiring substrate in FIG. 1.
Figure 4B:
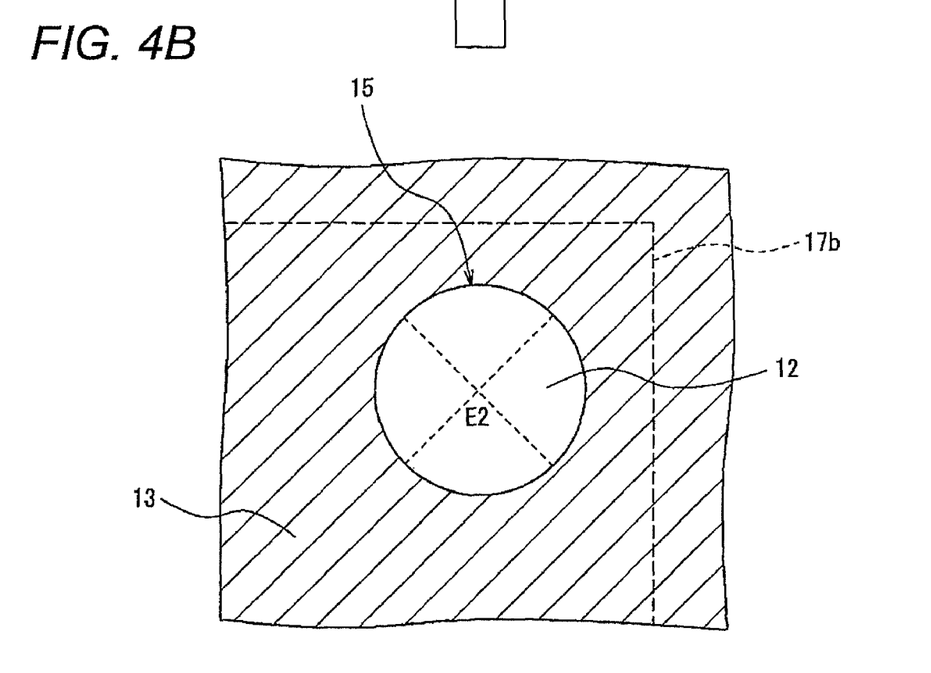

As shown in FIG. 4A (namely, enlarged view of portion "C" in FIG. 1), a connection pad 11 corresponding to a bump 21 is designed in such a manner that a center "E1" of the connection pad 11 is made coincident with a center of the bump 21. On the other hand, as shown in FIG. 4B) (namely, enlarged view of portion "D" in FIG. 1), a connection pad 12 corresponding to a bump 22 is designed in such a manner that a center "E2" of an opening portion 15 of the solder mask 13 (namely, center of exposed portion of connection pad 12 which is exposed to opening portion 15) is made coincident with a center of the bump 22. At this time, a positioning mark 16 for joining the wiring substrate 1 to the semiconductor chip 2 in the flip chip method is formed at a position on the wiring substrate 1, on which the connection pads 11 and 12 are not provided (refer to FIG. 1), in the NSMD structure.

In accordance with the above-described arrangement of the wiring substrate 1, the bumps 21 can be joined with respect to the connection pads 11 of which pad pitches can be narrowed in the flip chip method in high positional precision without any shifts in the bumps 21. However, since the positioning mark 16 has been formed in the NSMD structure, if the bumps 22 are joined to the connection pads 12 formed in the SMD structure in the flip chip method, then there is a problem that the bumps 22 may run up onto the solder mask 13 due to positional shifts when the opening portions 15 of the solder mask 13 are formed. In order to solve this problem, inner diameters of the opening portions 15 of the solder mask 13 are made larger than those of the conventional opening portions by 10 to 20 [μm]. More concretely speaking, in the present embodiment mode, the pad pitches of the connection pads 12 are made longer than, or equal to 100 [μm], and the inner diameters of the opening portions 15 of the solder mask 13 are set to approximately 80 to 90 [μm]. In other words, as to the connection pads 12, such a structure which is contrary to the requirement for making the narrow pitches is necessarily employed in order to solve the above-described problem.

As previously described in accordance with the disclosed wiring substrate, such a wiring substrate can be realized to which the semiconductor chip can be joined in the flip chip manner, in which the bumps arranged in the peripheral shape and the bumps arranged in the area array shape are mixed with each other. Also, the connection pads arranged in the area array shape located in the center portion of the wiring substrate can be formed in the SMD structure. Moreover, either the power supply line or the ground line of the uppermost layer of the wiring substrate can be easily formed in the plain, and the electric characteristic thereof can be improved.

Also, in accordance with the disclosed semiconductor device, the semiconductor chip operable under the low voltages can be mounted, so that the power saving effect can be achieved. In addition, since the wiring substrate having the superior electric characteristic is provided, the electric characteristic of the semiconductor device can be improved.

It should be understood that the present invention is not limited only to the above-described embodiment modes, but may be apparently changed, or modified without departing from the technical scope of the present invention. More specifically, although the semiconductor chips have been exemplified as the electronic components which are joined to the wiring substrate in the flip chip method, the present invention is not limited thereto.

What is claimed is:

1. A wiring substrate comprising:
   a semiconductor chip on which a plurality of bumps are mounted,
   a plurality of connection pads which are joined to the bumps mounted on the semiconductor chip in a flip chip method, and
   a solder resist including:
      an inner solder mask having area-array-shaped opening portions, and
      an outer solder mask defined around the inner solder mask through a frame-shaped opening portion,
   wherein connection pads of the plurality of connection pads on a peripheral portion of the wiring substrate are formed in a non-solder mask defined structure such that the connection pads are respectively within the area-frame-shaped opening portions and each opening portion is smaller than each connection pad,
   wherein a pitch of the connection pads of a peripheral portion of the plurality of connection pads of the wiring substrate is 100 μm or less; and
   a pitch of the connection pads of a center portion of the plurality of connection pads of the wiring substrate is 100 μm or less or more.

2. The wiring substrate as in claim 1, further comprising:
   a positioning mark employed in a positioning process when the semiconductor chip is joined to the wiring substrate in the flip chip method, wherein
   the positioning mark is formed in the non-solder mask defined structure.

3. The wiring substrate as in claim 1, wherein
   a plurality of or all of the connection pads of the center portion of the wiring substrate are formed in a flat plate shape in an integral body.

4. A semiconductor device manufactured by joining the bumps of the semiconductor chip in the flip chip method to the connection pads of the wiring substrate as in claim 1.

5. A semiconductor device as in claim 4, wherein centers of the connection pads are respectively coincident with centers of the bumps.

6. The wiring substrate as in claim 1, wherein
   the connection pads of the center portion of the wiring substrate are formed by solder mask having inner diameters of approximately 80 to 90 μm.

7. A wiring substrate comprising:
   a semiconductor chip on which a plurality of bumps are mounted,
   a plurality of connection pads which are joined to the bumps mounted on the semiconductor chip in a flip chip method, and
   a solder resist including:
      an inner solder mask having area-array-shaped opening portions, and
      an outer solder mask defined around the inner solder mask through a plurality of frame-shaped opening portions,
   wherein connection pads of the plurality of connection pads on a peripheral portion of the wiring substrate are formed in a non-solder mask defined structure such that the connection pads are respectively within the frame-shaped opening portions and the frame-shaped opening portions are larger than the connection pads, and
   connection pads of the plurality of connection pads on a center portion of the wiring substrate are formed in a solder mask defined structure such that the connection pads are respectively within the area-array-shaped opening portions and each opening portion is smaller than each connection pad,
   wherein a pitch of the connection pads of a peripheral portion of the plurality of connection pads of the wiring substrate is 100 μm or less, and
   a pitch of the connection pads of a center portion of the plurality of connection pads of the wiring substrate is 100 μm or less or more.

* * * * *